PHASE COMPARATOR FOR USE IN FREQUENCY SYNTHESIZER PHASE LOCKED LOOP

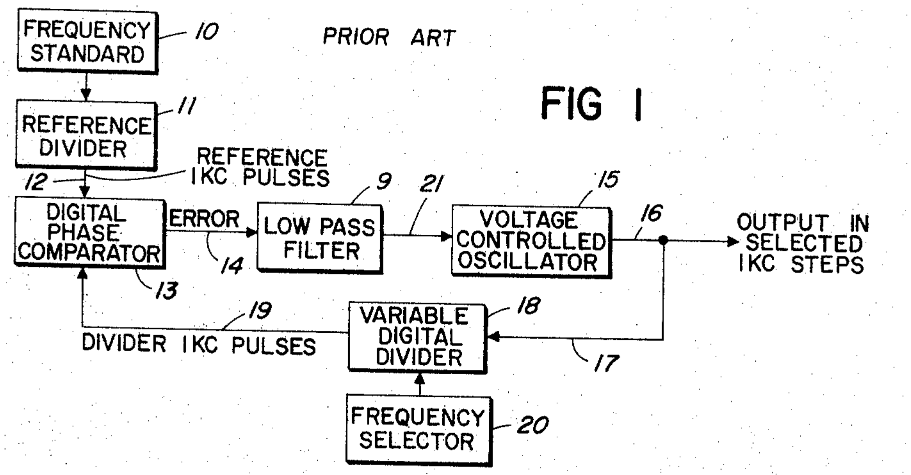
FIG 1
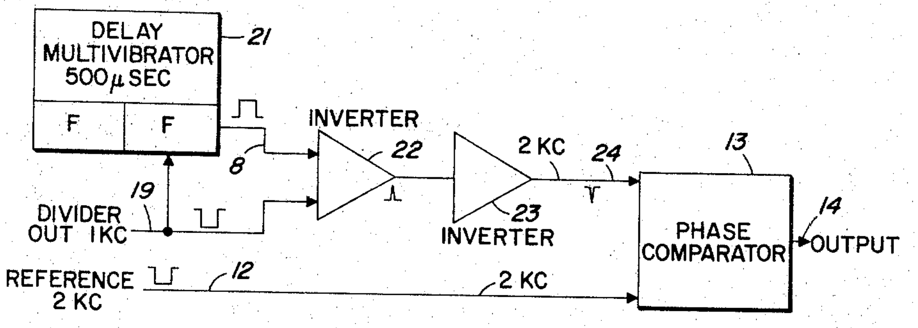
FIG 2
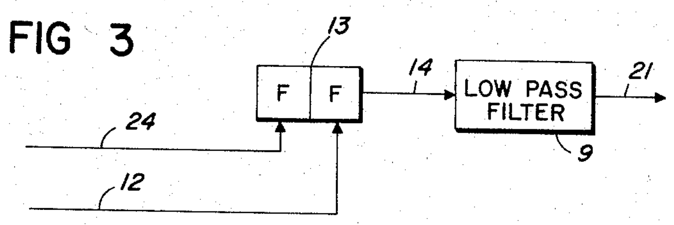
INVENTORS
Douglas R. Brase
Max E. Peterson
Tex C. Thomas
BY
Moody & Anderson
Agents INVENTORS
Douglas R. Brase
Max E. Peterson
Tex C. Thomas
BY
Moody & Anderson
Agents Aug. 22, 1967 D. R. BRASE ET AL 3,337,814

Filed Aug. 23, 1966 4 Sheets-Sheet 3

INVENTORS
Douglas R. Brase
Max E. Peterson
Tex C. Thomas

BY Moody & Anderson

Agents

INVENTORS
Douglas R. Brase
Max E. Peterson
Tex C. Thomas
BY
Moody & Anderson
Agents

United States Patent Office 3,337,814

Patented Aug. 22, 1967

3,337,814

PHASE COMPARATOR FOR USE IN FREQUENCY SYNTHESIZER PHASE LOCKED LOOP

Douglas R. Brase and Max E. Peterson, Richardson, and Tex C. Thomas, Garland, Tex., assignors to Collins Radio Company, Cedar Rapids, Iowa, a corporation of Iowa Filed Aug. 23, 1966, Ser. No. 580,138

12 Claims. (Cl. 331—18)

This invention relates generally to phase detection and more particularly to improvements in digital phase detection as employed in digital frequency synthesizers.

A typical digital frequency synthesizer is utilized to selectively generate a plurality of output frequencies in precisely controlled discrete steps as, for example, 1 kc. These types of frequency generators employ a phase locked loop including means by which the output frequency is divided down to a feedback frequency, corresponding to the output step frequency, which is compared with a like reference frequency in a phase comparator. The output of phase comparator controls a voltage controlled oscillator to generate the output frequency. A closed loop is thus formed from the output back through the phase comparator which in turn generates an error signal when the output frequency varies from a preselected value. In such systems it is important that the reference frequency be subjected to maximum attenuation in the loop and that the loop exhibits a minimum phase shift vs. frequency characteristic.

The present invention provides circuitry for particular usage in digital frequency synthesizers by means of which the feedback loop gain may be increased and the spurious reference frequency level at output of the phase comparator may be considerably reduced.

A further object of the present invention is the provision for enabling a digital frequency synthesizer to operate in discrete tuning steps of, for example, 1 kc., and yet permit phase comparison at twice the reference or 2 kc., such that the loop gain may be increased by a factor of 2 and a reduction of spurious reference frequency, or 1 kc. level, at the phase comparator output be experienced.

A further object of the present invention is the provision of an improved combination digital phase detector and active low pass filter, as might be especially employed in digital frequency synthesizers to improve reference frequency attenuation characteristics and provide for increased loop gain.

These and other objects and features of the invention will become apparent upon reading the following description in conjunction with the accompanying drawings in which:

FIGURE 1 is a block diagram of a typical digital frequency synthesizer employing a phase control loop;

FIGURE 2 is a functional diagram of a frequency doubler to be employed in the system of FIGURE 1 in accordance with the present invention;

FIGURE 3 is a functional diagram of a type of phase comparator which may be employed in the arrangement of FIGURE 2;

Figure 4A:
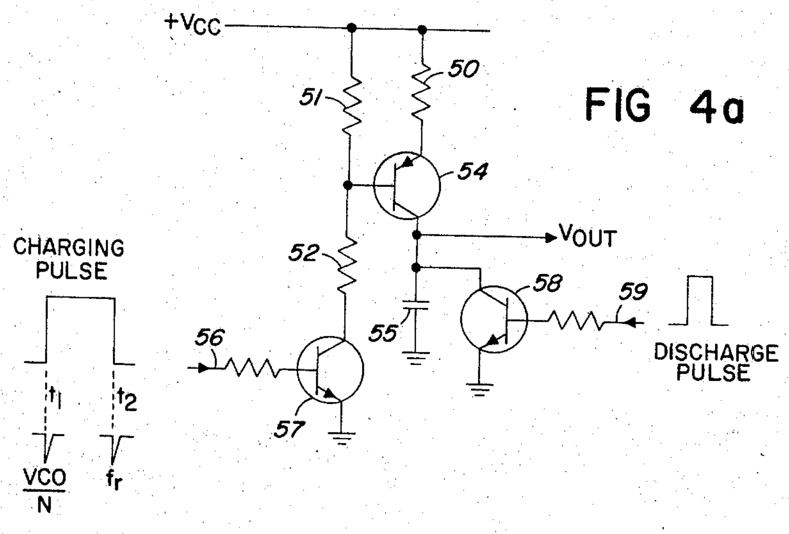
FIGURE 4 is a schematic diagram of a basic digital to analog converter circuitry as may be employed in pairs in an improved digital phase comparison means in accordance with the present invention.

A typical digital frequency synthesizer as currently employed in the art is illustrated functionally in FIGURE 1. The frequency of output 16 is selectively controllable in predetermined steps, as for example, 1 kc. steps. The output 16 is generated by a voltage controlled oscillator 15 under the control of a digital phase comparator 13. The output frequency 16 is applied through feedback line 17 as input to a variable digital divider 18. The selection of a given output frequency by the selecting arrangement 20 establishes a division ratio such that the divider 18 provides a pulse train output 19 at a 1 kc. repetition rate. For example, if the output were to be 500 kc., the digital divider 18 would divide down by a factor of 500 so as to produce a divider output 19 at 1 kc. A frequency standard 10 is applied to a reference divider 11, the division ratio of which is fixed such that the output from reference divider 11 is at a 1 kc. repetition rate. Frequency control for any selected output frequency 16 is then attained by phase comparing the reference 1 kc. pulses 12 with the divider output pulses 19. Any discrepancy in the phase of these two pulse trains generate an error at the output 14 of the comparator which may be applied through a low pass filter 9 to the voltage controlled oscillator 15 to phase lock the oscillator frequency with the reference frequency.

Known systems, as thus generally described and illustrated in FIG. 1, all present as design objectives, maximum attenuation of the reference frequency in the loop low pass filter and minimal phase shift through the loop low pass filter. It is to be realized that the phase comparison is performed on a digital basis; that is, a measure of the phase discrepancy between two trains of pulses or voltage spikes is to be measured. Ideally, the voltage controlled oscillator should be controlled by a precisely clean DC control voltage. Any switching transients or spurious signals on the 1 kc. control line 21 at the loop reference frequency provide problems in attaining exacting control of the voltage controlled oscillator.

The stated objective of the present invention is an improvement of the digital phace comparison technique and filter techniques within the control loop of a frequency synthesizer as depicted functionally in FIGURE 1. Towards this objective, a modification of the basic digital frequency synthesizer of FIGURE 1 in accordance with the present invention provides means where the phase comparison may be made to operate at twice the reference frequency and yet provide reference frequency tuning steps; for example, the circuit may be made to operate with 1 kc. tuning steps and yet provide phase comparison at 2 kc. This expedient increases the loop gain by two and reduces the spurious reference frequency level at the phase comparison output, thus minimizing the filter requirement before application to the voltage controlled oscillator.

With reference to FIGURE 2, the divider output pulses 19 are first applied to a frequency doubling network comprised of a delay multivibrator 21 and signal inverters 22 and 23. The doubling arrangement converts the 1 kc. train of pulses from the divider 18 to a train of pulses with twice the repetition rate or 2 kc. The reference frequency pulses 12 are then chosen to have a repetition rate of 2 kc. This later requirement may be readily attained by selecting the reference divider 11 of FIGURE 1 to have a division ratio in conjunction with the frequency of the standard 10 so that the output of the divider provides a 2 kc. reference. The output 24 of the frequency doubler corresponds to the divider output pulse doubled in frequency and is compared in phase comparator 13 with a 2 kc. reference pulse train.

The arrangement of FIGURE 2 is a simple and efficient way to double a pulse repetition rate. Assuming that the 1 kc. reference and counter pulses are negative going pulses, and that capacitive coupling is used throughout the doubling arrangement of FIG. 2, any transition from high voltage to low voltage will trigger any of the frequency doubling circuits; that is, the delay multivibrator 21 and the inverters 22 and 23. Thus, the 1 kc. divider output pulses 19 may be fed to the delay multivibrator 21 as shown in FIGURE 2, to trigger the multivibrator and also to the capacitively coupled inverter 22. The output of delay multivibrator 21 may also be capacitively coupled as a second input to inverter 22. In the absence of input pulses, inverter 22 is biased to saturation and inverter 23 would thereby cut off or at a high voltage. When an input pulse 19 from the divider output pulse train is present, inverter 22 is cut off for some period of time depending upon the circuit values used, and inverter 22 is switched into conduction to generate a negative going input for the phase comparator 13. Since delay multivibrator 21 is monostable, the delay time, or time spent in the unstable state is adjusted to be 500 microseconds; exactly one-half the time occurrence between successive ones of the 1 kc. counter pulses 19. Thus, exactly 500 microseconds after being triggered, multivibrator 21 switches back to cut-off from saturation, generating a second negative going pulse which triggers inverter 22 to cut off, which in turn, turns inverter 23 on to generate a second negative going pulse for application to the phase comparator. The output from inverter 23 is thus a train of negative going pulses being generated at 500 microsecond intervals and the 1 kc. input pulse train 19 is effectively doubled to a 2 kc. pulse train.

The 2 kc. divider output pulse train 24 and 2 kc. reference pulses 12 may be applied to a type of phase comparison as depicted in FIGURE 3. This comparator is in the form of a bistable multivibrator or flip-flop 13. The divider pulses 24 may be applied as trigger pulses to the set stage of the flip-flop and the reference pulses 12 may be applied as trigger inputs to the reset stage. The output 14 from multivibrator 13 is thus a train of square wave of pulses the duty cycle of which is proportional to the phase displacement between the input pulse trains 24 and 12. This type of phase detector, when used with a low pass filter 9, provides a linear DC output proportional to the phase displacement of the two input signals, and may be employed with the frequency doubling technique and double reference frequency in the system of FIGURE 1 to obtain a doubling of the loop gain and a reduction in the spurious 1 kc. level at the output 14 of the phase comparator. The inherent requirement that the output from the divider be at a repetition rate equal to the output frequency steps is retained with the advantage of phase comparison at twice the reference frequency. The present invention provides a further improvement in the basic digital synthesizer of FIGURE 1 in the provision of a sample-hold phase detecting scheme which functions both as a phase comparator and provides a loop filtering with little phase shift. The circuitry to be employed may replace the phase detector and filter of the circuitry of FIGURE 1 and, as will be later obvious, necessitates that the phase comparison be made at twice the frequency defined by the discrete steps desired at the output of the synthesizer; that is, phase comparison should be at 2 kc. when 1 kc. tuning steps are desired.

FIGURE 4*a* show the schematic of a basic building block of a sample and hold digital to analog converter in accordance with the present invention. The basic operation of the circuitry of FIGURE 4*a* is that of charging the capacitor 55 repetitively during a period of time representing the phase discrepancy between successive divider and reference pulses—the capacitor being operated in conjunction with a constant current source such that the voltage to which the capacitor charges is a measure of the phase discrepancy. These circuitries require some means of controlling the charge on the capacitor; that is, the capacitor must be periodically charged for the period of time defined by the phase discrepancies and periodically dumped or discharged. Further, some sort of retention and readout means must be employed and there must be provision for isolation between the output and the input.

When a single digital to analog converter circuit as shown in FIGURE 4*a* is employed in a frequency synthesizer control loop employing 1 kc. tuning steps, the comparator must charge and discharge at a 1 kc. rate and this action introduces spurious signals at 500 c.p.s. which places more stringent filter requirements into the system than if the transient or spurious frequency at the output of the phase detector were occurring at 1 kc. Thus, the sample and hold technique to be described here advantageously employs a pair of converter circuits as shown in FIGURE 4*a* in conjunction with a logic switching means whereby each one of the pair may be made to operate on a charge and discharge cycle at a 1 kc. rate when the input pulses are applied at twice the 1 kc. rate. The sample and hold phase detecting scheme to be described thus advantageously may be employed in conjunction with a frequency doubling arrangement for the divider output pulses as depicted in FIGURE 2.

Referring now to the basic operational circuit of FIGURE 4*a*, resistors 50, 51 and 52 and transistor 54 form a constant current charging source for the capacitor 55. Input terminal 56 might then receive a pulse with time duration proportional to the phase between the divider and reference pulse trains which determines the charge time for capacitor 55. This pulse may be applied to the base of transistor 57 so as to control the charge time of capacitor 55. The output of the circuit is the voltage across capacitor 55 and a discharge of the capacitor is effected by applying a positive going pulse to terminal 59 so as to control conduction of a further transistor 58 which, when it conducts, shorts out the capacitor 55. It is to be realized that the basic circuitry of FIGURE 4*a* would require logic switching circuitry to develop the charge and discharge pulses in proper time relationship. The basic operation of FIGURE 4*a* may be analyzed as follows: The voltage across capacitor 55 may be expressed as;

$$V=\frac{Q}{C} \qquad (1)$$

the change of V with respect to time is $$\frac{dV}{dt}=\frac{1}{C}\frac{dQ}{dt} \qquad (2)$$

But $$\frac{dQ}{dt}=i \qquad (3)$$

and, since $i$ is constant, Equation 2 becomes:

$$\frac{dV}{dt}=\frac{1}{C}\,i=\text{a constant} \qquad (4)$$

The voltage across C now becomes a linear function of the time transistor 54 is allowed to conduct. If $t_1$ and $t_2$ (FIGURE 4*a*) represent the time occurrence of output pulses of the sampled counter and reference frequencies, the voltage on capacitor 55 will charge to:

$$V_C=(t_2-t_1)\frac{dV}{dt}=(t_2-t_1)\frac{i}{C} \qquad (5)$$

Figure 4B:
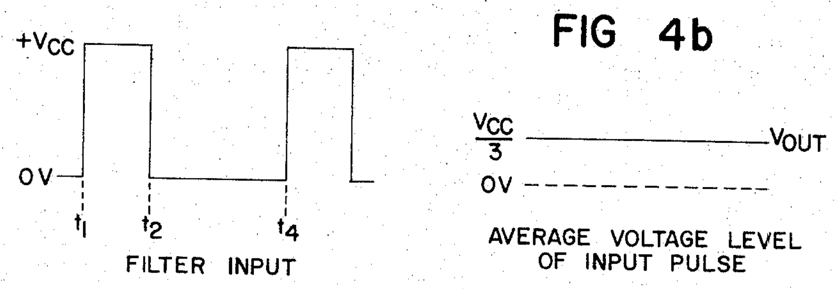
Figure 4C:
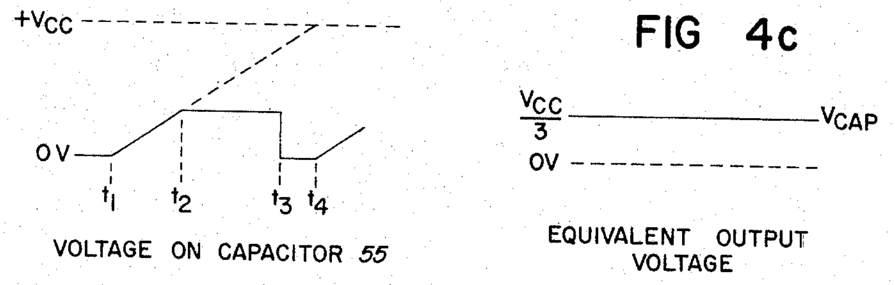

Referring to FIGURE 4*c*, it is obvious that if the charging current is stopped at $t_2$, the voltage on capacitor 55 (FIG. 4*a*) will be the same as the average voltage of the pulse of FIGURE 4*b*. At some time $t_3$, the capacitor must be discharged so that at time $t_4$, capacitor 55 can charge again, possibly to some new value if the phase of the two inputs has changed since time $t_1$ and $t_2$. The capacitor 55 is discharged (FIG. 4*a*) by applying a positive pulse to the base of transistor 58.

The main problem with this type of circuit is that of coupling the voltage on capacitor 55 to external circuitry and not coupling the charging and discharging portion, since a steady state DC voltage is desired as an output. The block diagram of FIGURE 5 is a complete sample and hold system employing a pair of circuits based on the circuitry of FIGURE *4a* which uniquely solves the problems associated with this type of detector and filter.

Figure 5:
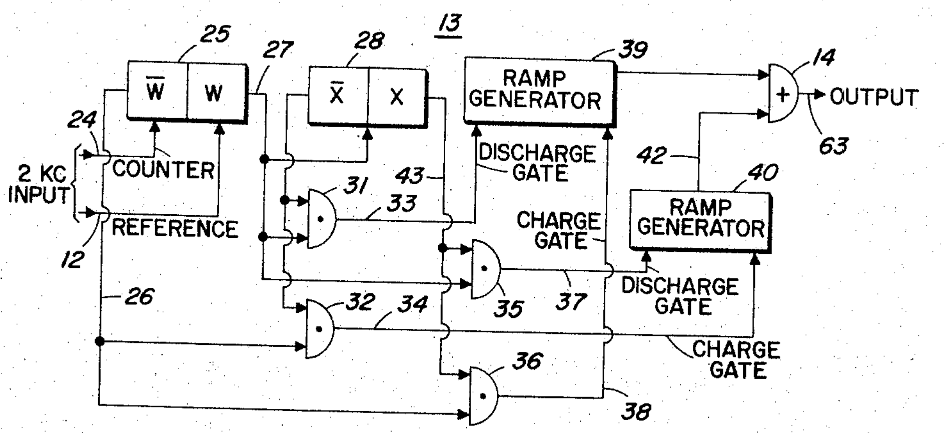
FIGURE 5 is a functional diagram of an improved sample and hold phase detector in accordance with the present invention.

If the circuit of FIGURE 5 is to replace the phase detector and filter of FIGURE 1, the VCO, divider output, and the reference frequency should be 2 kc. rather than 1 kc. The reason for this will become obvious later. Since the reference frequency is usually obtained by dividing down from a higher frequency source, reference division ratio may be changed from $N_{ref}$ to $(N_{ref})/2$. With the frequency synthesizers such as the one in FIGURE 1, the output of the variable divider must always be 1 kc. when the system is phase locked to the reference oscillator. Consequently, divider output may be applied to the frequency doubler of FIG. 2 to convert to a 2 kc. phase detector input.

With reference to FIGURE 5, the complete sample and hold phase detector circuitry is depicted functionally as a switching logic control circuitry in conjunction with first and second ramp generators whose outputs are combined. The divider feedback 2 kc. pulses 24 and the reference pulses 12 are applied as respective triggering inputs to a bistable multivibrator 25. Multivibrator 25 changes state with the presence of a negative going pulse being applied to the conducting or saturated stage. The output stage W of multivibrator 25 is coupled as a triggering input to both stages of a further multivibrator 28 which operates as a simple toggle. The output stage W of multivibrator 25 is additionally coupled as a first input to AND gates 31 and 35. The input stage $\overline{W}$ of multivibrator 25 is coupled as a first input to AND gates 32 and 36. The input stage $\overline{X}$ of multivibrator 28 is coupled as a second input to gates 31 and 32, while the output stage X of multivibrator 28 is coupled as the second input to AND gates 35 and 36. The output 33 from AND gate 31 functions as a discharge gate for a capacitor associated with a ramp generator 39. The output 38 of AND gate 36 serves as a charge gate for the capacitor associated with ramp generator 39. The outputs 37 and 34 from AND gates 35 and 32 similarly function as respective discharge and charge gates for a capacitor associated with a ramp generator 40. The outputs 41 and 42 from ramp generators 39 and 40 are coupled to an output signal combining circuitry 14 to produce the detector output 63 which, as will be described, is a DC voltage proportional in magnitude to the phase displacement between the feedback and reference input pulses.

Multivibrator 25 is of the set-reset variety and, since both the inputs 24 and 12 occur at a 2 kc. rate, the outputs from multivibrator 25 are 2 kc. pulses W and $\overline{W}$. The width or duty cycle of W and $\overline{W}$ is proportional to the phase difference between the divider output and the reference input pulses to the stage.

Multivibrator 28 functions as a simple toggle driven by the output (W) stage of multivibrator 25, and thus the output stage X of multivibrator 28 is 1 kc. square wave 43. The operation is depicted in waveforms (a), (b) (c) and (d) of FIGURE 7 which respectively indicate the 2 kc. divider output pulses 24, the 2 kc. reference input pulses 12, the output 27 from stage W of multivibrator 25 and the output 43 from stage X of multivibrator 28. The width of pulses 27 from multivibrator 25 is seen to be proportional to the phase discrepancy between the divider and reference input pulses.

The W and X outputs from multivibrators 25 and 28 along with their complementary $\overline{W}$ and $\overline{X}$ outputs are applied to the four AND gates to develop four logic control pulses to perform the respective charging and discharging of capacitors associated with the two ramp generators 39 and 40.

The circuitry of FIGURE 5 exhibits four different states of operation in repetitive sequence. Generally, the capacitors associated with each of the ramp generators 39 and 40 are alternately charged to potentials proportional to the phase discrepancy between the divider and reference input pulses and the charges are retained for a predetermined time at the termination of which the capacitors are discharged and the cycle repeated.

Figure 6:
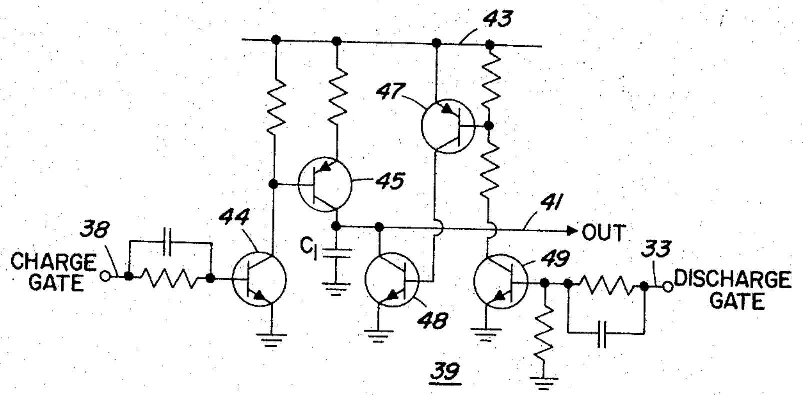
FIGURE 6 is a schematic diagram of a ramp generating means a pair of which are employed in the system of FIGURE 5.

FIGURE 6 schematically illustrates ramp generator 39. (Ramp generator 40 wuold comprise identical circuitry.) Ramp generator 39 is comprised of a capacitor $C_1$ in circuit with five transistors 44, 45, 47, 48, and 49. A charge gate 38 from AND gate 37 is applied to the base of transistor 44. Discharge gate 33 from AND gate 31 is applied to the base of transistor 49. The ramp generator consists generally of a constant current charging source in conjunction with the capacitor C along with control means to effect a discrete charging time and a control means to effect rapid discharge of the capacitor under the control of gate 33. In general operation, when transistor 44 is saturated by the presence of a charge gate 38, capacitor $C_1$ is charged linearly to approximately the supply potential 43. When transistors 48, 47, and 45 are all saturated by the presence of a discharge gate 33 on the base of transistor 49, capacitor $C_1$ is discharged.

There are four different states of operation for the circuitry of FIG. 5. The four states of operation are as shown in the truth table of Table 1 which illustrates the conductivity states of stages X and W of multivibrators 28 and 25 over a complete cycle of operation.

TABLE 1

| X | W | State | Activity |
|---|---|---|---|
| 0 | 0 | 1 | Ramp gen. 40 charges $C_2$. |
| 0 | 1 | 2 | Ramp gen. 39 discharges $C_1$. |
| 1 | 0 | 3 | Ramp. gen. 39 charges $C_1$. |
| 1 | 1 | 4 | Ramp. gen. 40 discharges $C_1$. |

The four AND gates 31, 32, 35 and 36 which are driven by the two multivibrator stages, detect each of the four states. Two distinct commands and one implied command are given to each of the ramp generators 39 and 40 (FIG. 6). The two distinct commands are (1) charge $C_1$ and (2) discharge $C_1$. The implied command is to hold the charge on $C_1$ for a given length of time. Similar commands would control a capacitor $C_2$ associated with the other ramp generator 40.

Figure 7:
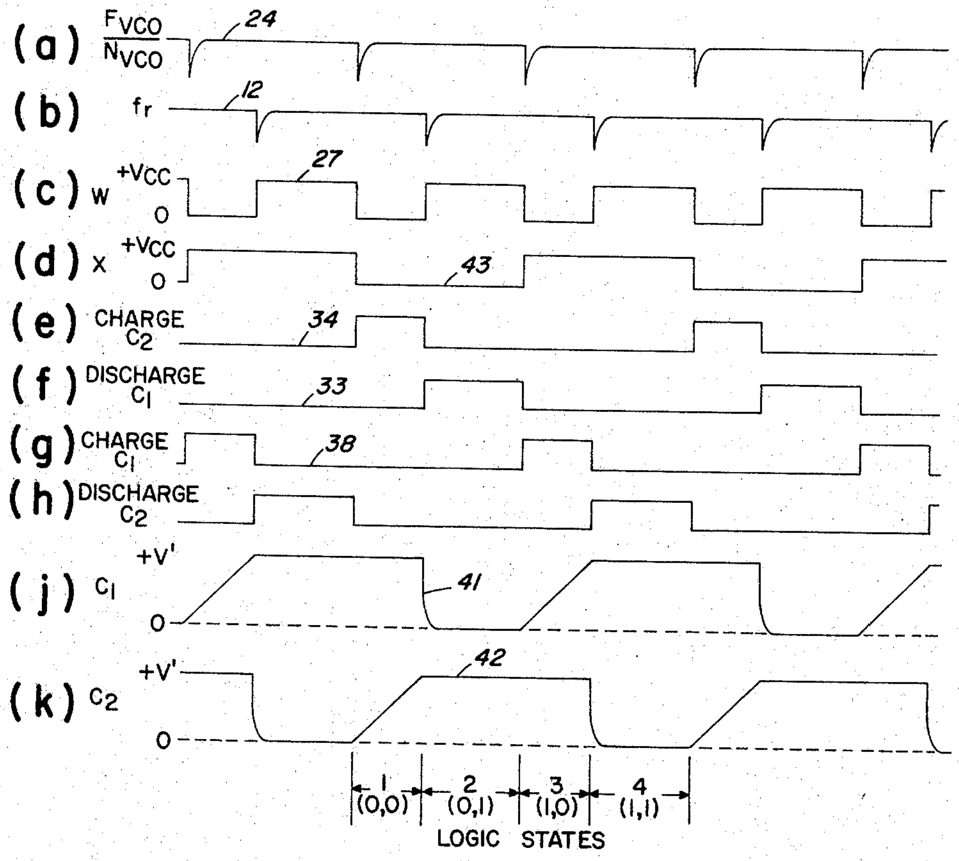
FIGURE 7 illustrates operational waveforms of the sample and hold phase detector of FIGURE 5.

During state 1 ($X=0$, $W=0$) a command to charge the capacitor $C_2$ of the ramp generator 40 is generated by gate 32 which, with reference to FIGURE 5, receives $\overline{X}$ and $\overline{W}$ to generate a positive going gate $(1\cdot 1)$. Gate 34 is illustrated in waveform (e) of FIGURE 7 and is seen to occur during the period of time when W and X are in state "0." Waveform (k) of FIGURE 7 illustrates the charging of capacitor $C_2$ of ramp generator 40 during this period. The capacitor charges linearly to a value proportional to the phase displacement between the reference and divider output pulses. During this state 1, the implied command to hold a charge on capacitor $C_1$, of ramp 39 is maintained as illustrated in waveform (j) of FIGURE 7.

During state 2 ($X=0$, $W=1$), the command to discharge capacitor $C_1$ in ramp generator 39 is generated by gate 31 as the positive going gate 33 of waveform (f) of FIGURE 7. Reference to FIGURE 5 shows that gate 31 receives input $\overline{X}$ and W thus, during state 2, receives a pair of positive pulses to develop a positive gate output 33. Waveform (f) is applied to the discharge gate of ramp generator 39 (FIGURE 6) and waveform (j) of FIGURE 7 illustrates the discharge of capacitor $C_1$ at the occurrence of logic state 2. During logic state 2, waveform (k) of FIGURE 7 illustrates that the charge on capacitor $C_2$ of ramp generator 40 is retained.

During logic state 3 ($X=0$, $W=0$) the command to charge capacitor $C_1$ of ramp generator 39 is generated by gate 36 which receives inputs X and $\overline{W}$ which during this period are positive so as to develop a positive gate pulse during the period. The charge on $C_2$ ramp generator 40 is further retained as shown in waveform (k) of FIGURE 7, and capacitor $C_1$ of ramp generator 39 again charges linearly to a value proportional to the phase displacement between the divider output and reference input pulses.

At the time of arrival of logic state 4 ($X=1$, $W=1$) gate 35 generates the command to discharge capacitor $C_2$ of ramp generator 40 as illustrated in waveform (k) of FIG. 7 and the implied command to hold the charge of $C_1$ of ramp generator 39 waveform (j) during state 4 and state 1 of the ensuing cycle is generated.

The output waveforms (j) and (k) of the two ramp generator circuits show that each capacitor ($C_1$ in ramp generator 39, and $C_2$ in ramp generator 40) must hold its charge for two states of the truth table of Table 1. Each of the output waveforms 41 and 42 thus periodically and alternately includes a D.C. level which is proportional to the phase displacement between the divider output and reference input pulses. These two waveforms (j) and (k) are combined in the output circuitry 14 (FIG. 5) so as to be applied to the output 63 only at the start of the states 2 and 4, and thus the output may be seen to effectively switch from one ramp generator to the other, and this switching, by inspection of FIG. 7, occurs at a 1 kc. rate. The ripple on the output will again be 1 kc., though the input wave comparison is made at a 2 kc. rate. Thus, the lowest frequency of the resulting output waveform will be 1 kc. and this determines the cutoff frequency of any ensuing low pass filter which may be used, or it determines the frequency where phase shift equals 90°. For a 1 kc. sample system, this frequency would be 250 c.p.s. If the two input frequencies had been 1 kc. rather than 2 kc., the lowest frequency component at the output would have been 500 c.p.s. and a phase shift of 90° would occur at 125 c.p.s.

Figure 8:
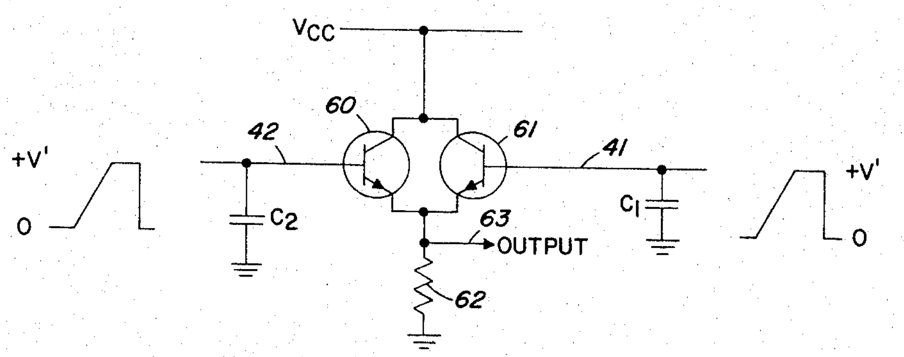
FIGURE 8 is a schematic diagram of an output signal combining arrangement employed in the system of FIGURE 5.

The means by which the two output phase frequencies (j) and (k) of FIG. 7 may be combined so that only DC appears at the output 63, and the charging and discharging of the capacitor $C_1$ and $C_2$ is prevented from appearing on the output lead, is illustrated in the output combining circuit 14 of FIG. 8. FIG. 8 illustrates the output voltages 41 and 42 of ramp generators 39 and 40 as being the voltage across the respective ramp generator capacitors $C_1$ and $C_2$. These ramp generator outputs 41 and 42 are applied to the respective bases of transistors 61 and 60 the collector elements of which are connected in common to a DC source and the emitter elements of which are connected through a common load resistor 62 to the source reference or ground. An output 63 is taken as the voltage developed across the common load resistor 62. In operation, the voltage across the common load resistor 63 is alternately that of the stored charge on capacitors $C_1$ and $C_2$. With reference to FIG. 7, output 63 is the stored charge of the capacitor $C_2$ during the logic states 2 and 3 and is the stored charge on capacitor $C_1$ during logic states 4 and 1. This action may be explained by assuming that the voltage on $C_1$ is 6.6 volts whereupon the circuit components of FIG. 8 might develop an output voltage across load resistor 62 of approximately 6.0 volts. While $C_2$ is being discharged and then charged again (states 4 and 1) the base emitter junction of transistor 60 is back-biased, and the output is independent of the voltage on $C_2$. At the state of logic state 2, $C_2$ has been charged and if this voltage is now assumed to be 6 volts, the output across the load resistor 62 would drop to 5.4 volts with the discharge of $C_1$ until the time that the base-emitter junction of transistor 61 is reversed-biased, at which time voltage across the resistor 63 becomes independent of the charge on $C_1$. This action then effectively combines the two ramp generator outputs 41 and 42 in a manner such that the charging of the capacitors is not reflected in the output and the output is a series of "read-outs" of the two ramp generator capacitors in sequence with spurious signals occurring at a 1 kc. switching rate. By using two ramp generators and the combiner illustrated in FIGURE 8 a much faster response is achieved than in the scheme utilizing single ramp generating circuits such as illustrated in FIGURE 4*a*. With a single ramp generator arrangement, a storage capacitor and charging diode would generally be used to eliminate the charging and discharging of the ramp generator capacitors at this output. A single ramp generator arrangement exhibits more phase shift because of the discharge time of the storage capacitor and exhibits less attenuation because of the circuit techniques used to discharge the storage capacitor. The dual ramp generator circuits as utilized in the FIGURE 5 embodiment exhibits a phase shift of 90° between 240 and 250 c.p.s., which is nearly the theoretical limit.

The present invention is thus seen to present means for improvements in frequency synthesizer phase comparator techniques by means of which loop gain is improved and loop filtering enhanced.

Although this invention has been described with respect to a particular embodiment thereof it is not to be so limited as changes might be made therein which fall within the scope of the invention as defined by the appended claims.

We claim:

1. A digital frequency synthesizer of the type employing a voltage controlled oscillator controllable in discreet frequency steps, the output of the voltage controlled oscillator being applied to a decade digital divider and divided down to a predetermined output feedback frequency equal that of said output steps, a reference frequency source, phase comparison means to which said reference frequency source and divider feedback signals are applied for phase comparison, the output from said phase comparison means being applied to said voltage controlled oscillator to complete a control loop for controlling the frequency of said oscillator; means for generating voltage controlled oscillator output frequencies in controllable steps of predetermined frequency separation and phase comparing in said phase comparison means at a frequency twice that of said output steps, comprising said reference frequency source providing a frequency twice that of the output of said divider, frequency multiplying means receiving the output of said divider and multiplying said output frequency by a factor of two, said phase comparison means receiving said reference frequency and the output of said frequency multiplying means, said phase comparison means developing a direct voltage output signal the average of which is proportional to the phase discrepancy between the input signals thereto, whereby the level of spurious signals at the frequency corresponding to said output steps is reduced at the output of said phase comparison means and gain in said control loop is increased twofold.

2. Circuitry as defined in claim 1 wherein said reference frequency source comprises a reference frequency standard applied to reference frequency dividing means to obtain output pulses at twice the output frequency of said feedback divider output signal, said phase comparison means comprising a bistable multivibrator including first and second stages the output from said reference frequency divider and said feedback divider being respectively applied as trigger pulses to the first and second stages of said bistable multivibrator, and an output taken from one of the stages of said bistable multivibrator in the form of a pulse train the duty cycle of which is proportional to the phase difference between the reference and feedback divider pulses as applied to said multivibrator.

3. Circuitry as defined in claim 1 wherein said frequency multiplying means comprises a delay multivibrator to which the output from said feedback divider is applied as a trigger source, said delay multivibrator being adapted to provide an output pulse in response to each divider pulse thereto the time duration of which is equal to one half the repetition rate of said divider pulses, a first signal inverter receiving the output of said multivibrator and receiving the output of said divider as common inputs thereto, said first inverter being biased to saturation in the absence of input pulses thereto, a second signal inverter receiving the output of said first inverter, said second signal inverter being biased to nonconduction in the absence of input pulses thereto, each divider pulse triggering said delay multivibrator to effect cut-off of said first signal inverter and thereby render said second signal inverter conductive to generate a negative output signal, the termination of the fixed width pulse from said delay multivibrator generating a further negative-going pulse to render said first signal inverter nonconductive and said second signal inverter conductive to generate a second negative-going output pulse the time occurrence of which follows each said divider pulse by the delay time of said multivibrator, the negative going output pulse from said second signal inverter being applied to said phase comparison means, said second signal inverter output pulses having a repetition rate twice that of said divider output pulses equal that of said reference frequency divider output pulses.

4. Circuitry as defined in claim 3 wherein said phase comparator comprises a sample-hold detecting circuitry including means developing first and second voltages respectively proportional in magnitude to the phase difference between said divider output and reference pulses during alternate occurrences of pairs of said pulses, means for holding each said voltage for an ensuing period of time corresponding to the repetition rate of said reference pulses and, at the conclusion of said hold period dumping said hold voltage to zero, and output signal combining means receiving said first and second voltages to produce a composite output signal comprised of alternate intervals of the magnitudes of said first and second signals during those periods of time during which neither of said signals is building up to said proportional magnitude or being dumped to zero.

5. Circuitry as defined in claim 4 wherein the means for developing said first and second voltages comprises first and second ramp generating means respectively including first and second capacitors, said counter and reference pulses being applied to logic control means to provide control pulses establishing four operating states for said pair of said ramp generators, the first operating state charging said first capacitor to a voltage proportional to the phase difference between said counter and reference pulses, the second operating state effecting a retention of the charge on said first capacitor and a discharge of said second capacitor, a third operating state effecting further retention of the charge of the said first capacitor and charging said second capacitor to the phase difference between said counter and reference pulses, a fourth operating state retaining the charge on said second capacitor and discharging said first capacitor, the output from said signal combining means corresponding alternatively and sequentially to the voltages on said first and second capacitors at a rate defined by one half the repetition rate of the input pulses to said comparator.

6. Circuitry as defined in claim 4 wherein the means for developing said first and second voltages comprises first and second ramp generators including means to selectively charge and discharge first and second capacitors respectively associated with said ramp generators under the control of pairs of control pulses, logic pulse developing means receiving said counter and reference pulses and developing therefrom said pairs of control pulses, first pulses of said control pulse pairs being developed in time synchronization with sequential ones of said counter pulses to alternately effect charging of said first and second capacitors respectively, second ones of said control pulse pairs being developed in time synchronization with sequential ones of said reference pulses to alternately effect discharge of said second and first capacitors respectively.

7. Circuitry as defined in claim 6 wherein said logic pulse developing means comprises a first bistable multivibrator including first and second stages to which said divider and reference pulses are respectively applied as trigger pulses, a second bistable multivibrator including first and second stages, first, second, third, and fourth AND gates, the output from the second stage of said first multivibrator being applied as a trigger to the first and second stages of said second multivibrator and further as a first input to said first and third AND gates, the output of the first stage of said first multivibrator being applied as a first input to said second and fourth AND gates, the output of the first stage of said second multivibrator being applied as a second input to said first and second AND gates, the output of the second stage of said second multivibrator being applied as a second input to said third and fourth AND gates, the outputs of said fourth and first AND gates connected to said first ramp generator to respectively effect charging and discharging of said first capacitor, and the outputs of said second and third AND gates connected to said second ramp generator to respectively effect charging and discharging of said second capacitor.

8. Circuitry as defined in claim 7 wherein said output signal combining means comprises a pair of transistors the collectors of which are connected in common to the first terminal of a supply voltage source, the emitters of said transistors being connected in common through a load resistor to the second terminal of said voltage supply source, the outputs from said first and second ramp generators being applied respectively to the bases of said first and second transistors and an output taken across said common load resistor.

9. A digital phase comparator for developing a direct current output signal the magnitude of which is proportional to the phase displacement between a variable phase pulse train and a reference phase pulse train, comprising means developing first and second direct current voltages respectively proportional in magnitude to the phase difference between said variable phase pulses and said reference phase pulses during alternate occurrences of pairs of said pulses, means for retaining each said direct current voltage for an ensuing period of time corresponding to the repetition rate of said reference phase pulses and, means for dumping said voltage to zero at the conclusion of said retaining periods, and output signal combining means receiving said first and second direct current voltages and switching to a common output line those portions of said first and second voltages corresponding to the retaining periods of each of said voltages.

10. Circuitry as defined in claim 9 wherein the means for developing said first and second direct current voltages comprises first and second ramp generating means respectively including said first and second capacitors, said variable phase and reference phase pulse trains being applied to logic gating means, said logic gating means developing four output gate trains establishing respectively four operating states for said pair of ramp generators, the first operating state effecting charge of said first capacitor to a voltage proportional to the phase difference between said variable phase and reference phase pulse trains, the second operating state effecting the retention of a charge on the first capacitor and a discharge of the second capacitor, the third operating state effecting retention on the charge of said first capacitor and charging said second capacitor to a voltage proportional to the phase difference of said variable phase and said reference phase pulse trains, the fourth operating state retaining the charge on the second capacitor and effecting a discharge of said first capacitor, said output signal combining means developing an output sequentially proportional to the charge on said first and second capacitors at a rate defined by one half the repetition rate of said pulse trains.

11. Circuitry as defined in claim 10 wherein said logic pulse developing means comprises a first bistable multivibrator including first and second stages to which said divider and reference pulses are respectively applied as trigger pulses, a second bistable multivibrator including first and second stages, first, second, third, and fourth AND gates, the output from the second stage of said first multivibrator being applied as a trigger to the first and second stages of said second multivibrator and further as a first input to said first and third AND gates, the output of the first stage of said first multivibrator being applied as a first input to said second and fourth AND gates, the output of the first stage of said second multivibrator being applied as a second input to said first and second AND gates, the output of the second stage of said second multivibrator being applied as a second input to said third and fourth AND gates, the outputs of said fourth and first AND gates connected to said first ramp generator to respectively effect charging and discharging of said first capacitor, and the outputs of said second and third AND gates connected to said second ramp generator to respectively effect charging and discharge of said second capacitor.

12. Circuitry as defined in claim 11 wherein said output signal combining means comprises a pair of transistors the collectors of which are connected in common to the first terminal of a supply source, the emitter of said transistor being connected in common through a load resistor to the second terminal of said voltage supply source, the outputs from said first and second ramp generators being applied respectively to the bases of said first and second transistors and an output taken across said common load resistor.

No references cited.

ROY LAKE, *Primary Examiner.*

J. KOMINSKI, *Assistant Examiner.*